(12) United States Patent
Tang

(10) Patent No.: US 7,284,597 B2
(45) Date of Patent: Oct. 23, 2007

(54) HEAT SINK WITH COMBINED PARALLEL FINS AND THE METHOD FOR ASSEMBLING THE SAME

(75) Inventor: Sheng-Jie Tang, Shenzhen (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei-Hsien (TW)

( * ) Notice: Subject to any disclaimer, the term of this patent is extended or adjusted under 35 U.S.C. 154(b) by 116 days.

(21) Appl. No.: 11/162,609

(22) Filed: Sep. 16, 2005

(65) Prior Publication Data
US 2006/0157224 A1    Jul. 20, 2006

(30) Foreign Application Priority Data
Jan. 14, 2005   (TW) ............................. 94101107 A

(51) Int. Cl.
*F28F 3/08*   (2006.01)

(52) U.S. Cl. .................. 165/80.3; 361/704

(58) Field of Classification Search ...... 165/80.1–80.3, 165/185; 361/704
See application file for complete search history.

(56) References Cited

U.S. PATENT DOCUMENTS

| | | | | |
|---|---|---|---|---|
| 2,434,676 A | * | 1/1948 | Spender | 165/182 |
| 6,336,498 B1 | * | 1/2002 | Wei | 165/80.3 |
| 6,382,307 B1 | * | 5/2002 | Wang et al. | 165/80.3 |
| 6,449,160 B1 | * | 9/2002 | Tsai | 165/80.3 |
| 6,607,023 B2 | * | 8/2003 | Ho et al. | 165/78 |
| 6,651,733 B1 | * | 11/2003 | Horng et al. | 165/80.3 |
| 6,657,865 B1 | * | 12/2003 | Tseng et al. | 165/80.3 |
| 6,672,379 B1 | * | 1/2004 | Lin et al. | 165/185 |
| 6,789,609 B2 | * | 9/2004 | Tsai et al. | 165/78 |
| 2005/0056398 A1 | * | 3/2005 | Lai | 165/80.3 |
| 2006/0144580 A1 | * | 7/2006 | Wang | 165/182 |

* cited by examiner

*Primary Examiner*—Teresa J. Walberg
(74) *Attorney, Agent, or Firm*—Winston Hsu

(57) ABSTRACT

A heat sink for removing heat from a heat-generating device includes a fin combination (10). The fin combination includes a plurality of fins interconnected together, each fin including a body (12), a flange (14) extending from the body and bent from an edge of the body, a tab (16) extending from an outer edge of the flange, a slot (17) formed in the body, and a detent (160) formed at a junction portion between the tab and the flange. The slot of a fin receives the tab of an adjacent fin. The detent of the adjacent fin engages with the flange and the body of the fin at a position near the slot of the fin, whereby the fin combination has the fins firmly connected together.

7 Claims, 8 Drawing Sheets

HEAT SINK WITH COMBINED PARALLEL FINS AND THE METHOD FOR ASSEMBLING THE SAME

FIELD OF THE INVENTION

The present invention relates generally to a heat sink, and more particularly to a heat sink having high density fins, and the fins can be firmly combined together.

DESCRIPTION OF RELATED ART

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat sinks are frequently used to dissipate heat from these electronic devices.

However, contemporary CPUs are performing tasks faster and faster and orient to be smaller and smaller in sizes, thus generating more and more heat in relative small volumes. Typical heat sinks are often integrally made by extruding aluminum. The kind of integral heat sink has a base and a plurality of spaced fins extending upwardly from the base. However, the height-to-width (H/W) ratio of the heat sink is limited by the extruding process. Thus, the effective heat-dissipating area of the heat sink is restricted. The heat can not be dissipated adequately even if the heat sink is assembled with an electric fan. Then this type of heat sink can not fit the heat dissipating requirement of electronics devices any more.

In order to overcome the problem of aluminum extrusion, a different heat dissipating structure is provided. Referring to FIG. 1, it shows a heat sink formed by a plurality of heat sink fins 102 formed separately and then assembled together. Each fin 102 forms two flanges 104 at upper and lower sides thereof, respectively. The lower flanges 104 of the fins 102 are soldered to a metal base 106. Then the heat dissipating area of the heat sink is enlarged and performance of the heat dissipation is improved. However, to arrange the fins 102 on the base 106 one by one in order to solder the fins 102 to the base 106 is time consuming, and the production efficiency is low.

To overcome the disadvantages of the heat sink of FIG. 1, a further heat sink 210 is proposed as shown in FIG. 2. The heat sink 210 includes a plurality of fins 202 and a metal base 212. Each fin 202 forms two flanges 204 at upper and lower sides thereof, respectively. Each flange 204 has a plurality of cutouts 206 and tabs 208 opposite to the cutouts 206. The fins 202 are interconnected together to form the heat sink 210 by fitting the tabs 208 into corresponding cutouts 206. Then the heat sink 210 is soldered to the base 212.

However, the combined heat sink 210 as shown in FIG. 2 is relatively loose, since the fins 202 are combined together only through tabs 208 fitting into cutouts 206. In addition, the connecting points of the fins 202 are positioned at the lower and upper flanges 204 of the fins, wherein the lower flanges 204 are used to be soldered to the base 212. The connecting points at the lower flanges cause the lower flange to have an uneven contact with the base 212. Such uneven contact lowers the heat-conductive efficiency between the base 212 and the fins 202.

Therefore, it is desired to design a novel heat sink to overcome the aforementioned problems and increase the heat dissipation effect thereof.

SUMMARY OF INVENTION

A heat sink for removing heat from heat-generating devices in accordance with a preferred embodiment of the present invention includes a fin combination. The fin combination includes a plurality of fins interconnected together. Each fin includes a body, a flange extending from the body and bent from an edge of the body, a tab extending from an outer edge of the flange, a slot formed in the body, and a detent formed at a junction portion between the tab and the flange. The slot of a fin receives the tab of an adjacent fin. The detent of the adjacent fin abuts against the body and the flange of the fin at a position near the slot of the fin.

A method for assembling the heat sink in accordance with the preferred embodiment of the present invention, includes steps of:

a). preparing a plurality of fins each including a body with a flange perpendicularly extending from the body, a tab extending from the flange, and a slot formed between the body and the flange, the flange forming a protrusion on an outer side thereof;

b). inserting the tab of a fin into a slot of an adjacent fin to a position where the tab is located neighboring the protrusion of the flange of the adjacent fin; and c). pressing the protrusion of the flange of the adjacent fin to flatten the protrusion to thereby securely fasten the flange of the adjacent fin and the tab of the fin together, wherein a detent is formed at a junction between the tab and the flange of the fin. The detent abuts against the body and the flange of the adjacent fin at a position near the slot of the adjacent fin.

Other advantages and novel features of the present invention will become more apparent from the following detailed description when taken in conjunction with the accompanying drawings, in which:

DETAILED DESCRIPTION

Figure 1:
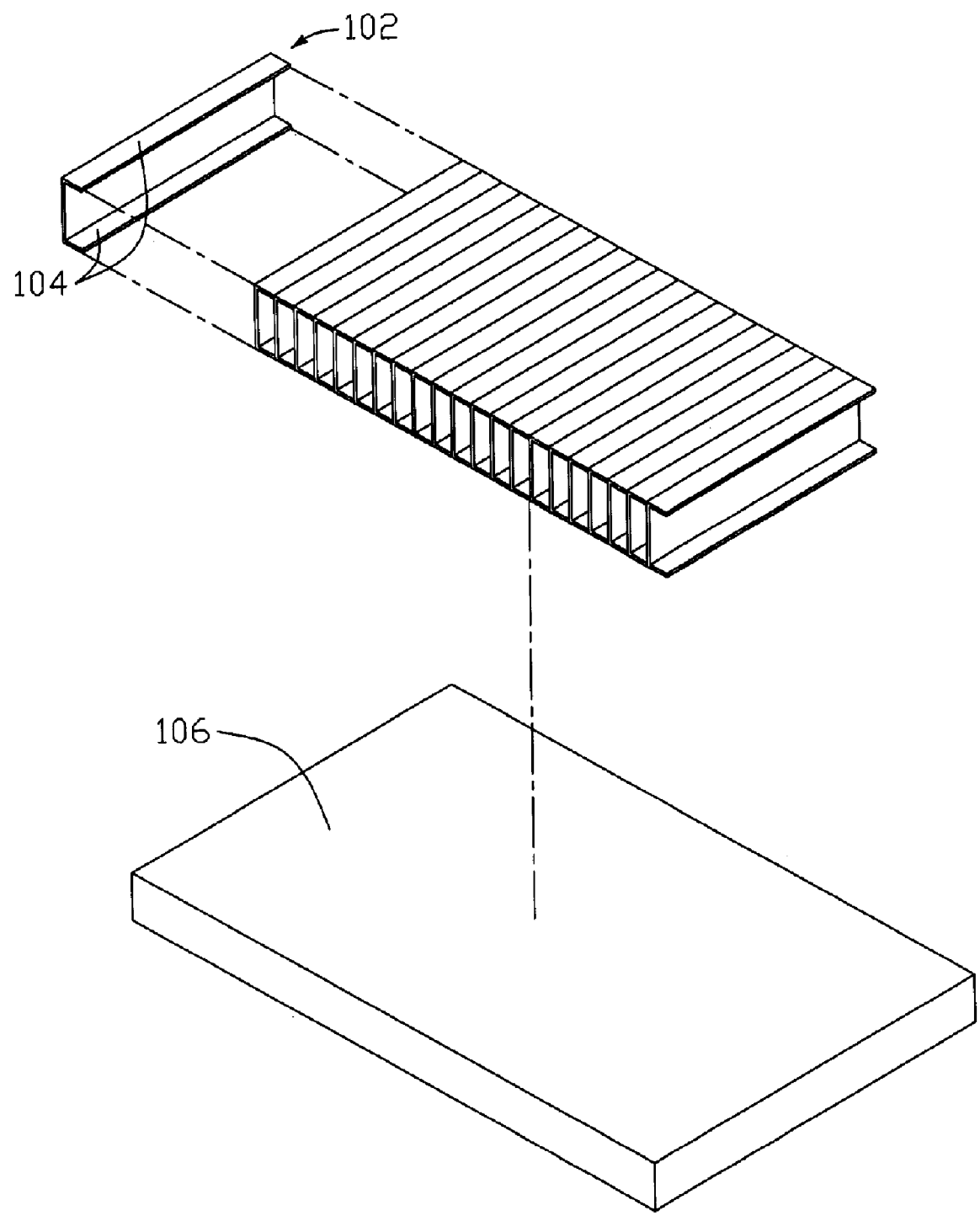
FIG. 1 is an exploded view in accordance with a conventional heat sink.

Reference will now be made to the drawing figures to describe the preferred embodiment in detail.

Figure 3:
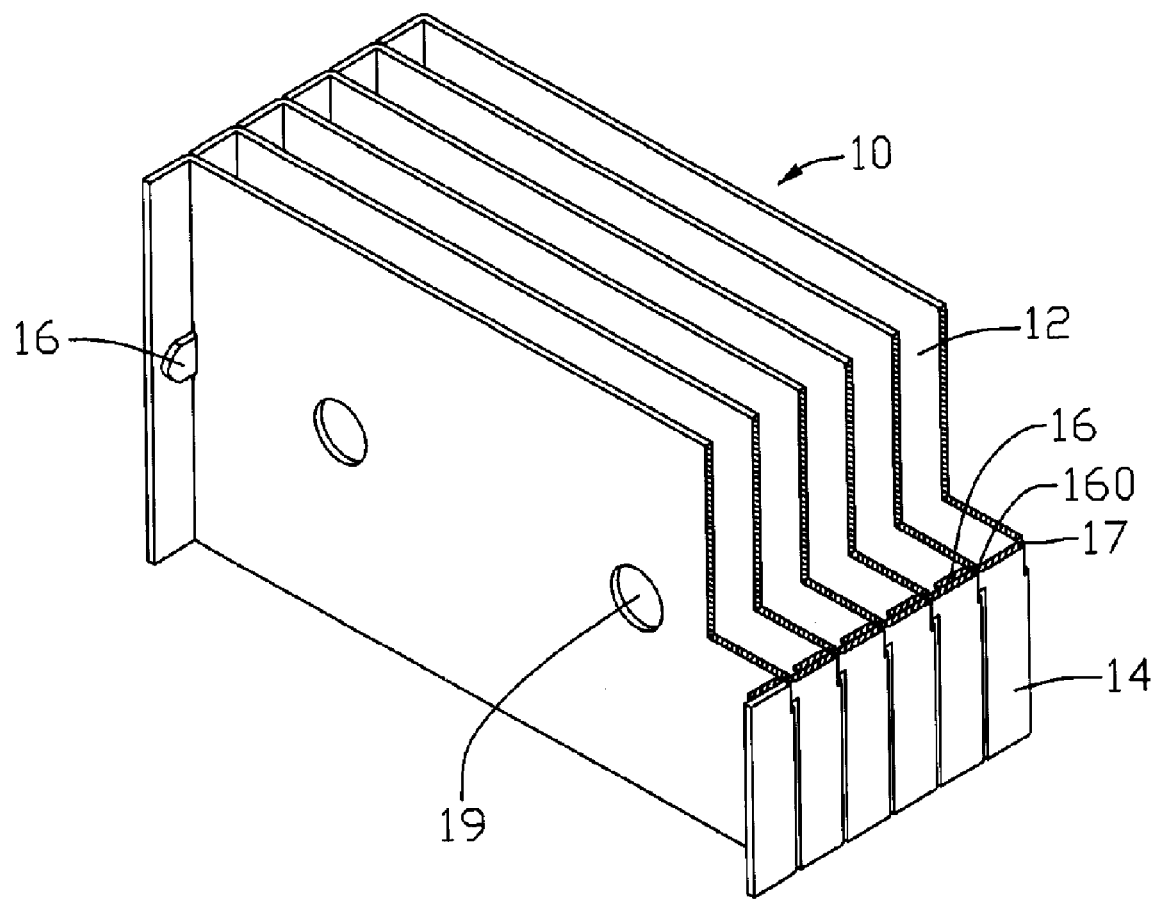
FIG. 3 is an isometric, partly cut-away view of a fin combination in accordance with a preferred embodiment of the present invention.
Figure 4:
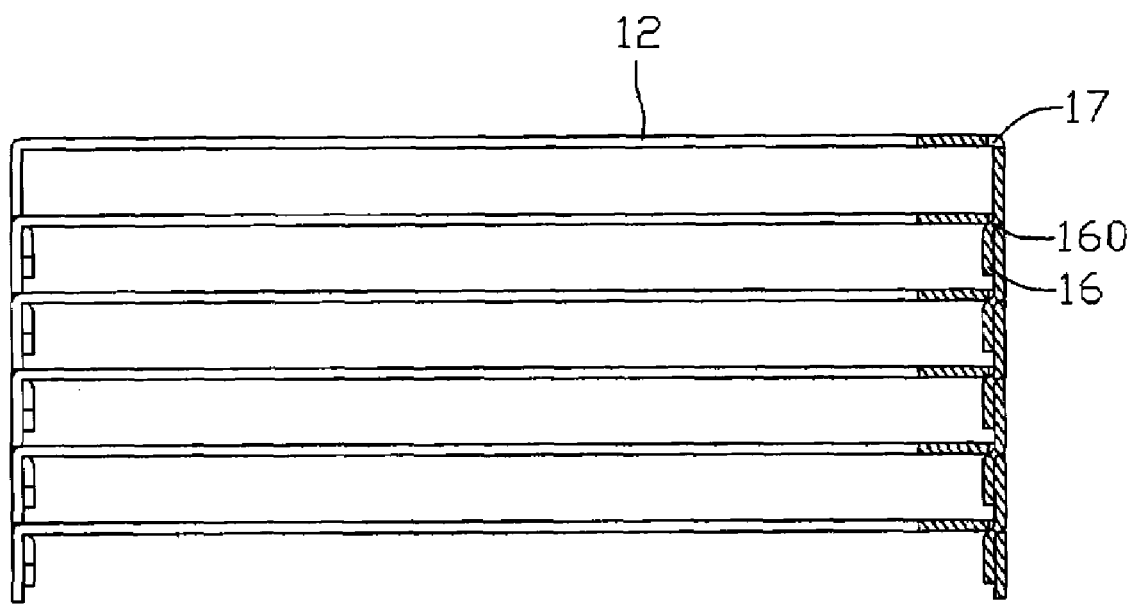
FIG. 4 is a top plan view of the fin combination of FIG. 3.

Referring FIG. 3 and FIG. 4, a fin combination 10 is shown, consisting of a plurality of fins (not labeled) interconnected together. Each fin includes a body 12 and two flanges 14. The flanges 14 extend from opposite sides of the body 12 respectively and perpendicularly to the body 12. A slot 17 is formed at a junction portion of the body 12 and the flange 14. A tab 16 extends from a front edge of each of the flanges 14. The tab 16 has a thickness which is designed according to a width of the slot 17 in such manner that the tab 16 is fittingly insertable through the slot 17. A detent 160 is formed at a junction portion between the tab 16 and the flange 14. The detent 160 abuts against the flange 14 and the body 12 of an adjacent fin at a position near the slot 17 of the adjacent fin. Furthermore, the body 12 defines two holes 19 for insertion of two posts therein, in order to facilitate the assembly of the fins, or for insertion of two heat pipes therein, in order to promote the heat dissipating effectiveness of the fin combination 10.

Due to the structure that the detents 160 of the fin abut the body 10 and flanges 14 of the adjacent fin, the two fins are securely connected together so that the fin combination 10 can have all of the fins securely connected together. The fin combination 10 has a sturdy structure and can be easily and reliably put on a metal base (not shown) to be soldered thereto with bottom sides of the flanges and bodies of the fins to obtain a heat sink. The metal base is well known to those skilled in the art and can have structure the same as the metal base 212 of FIG. 2. Thus, the metal base is omitted from FIGS. 3 and 4.

Figure 5:
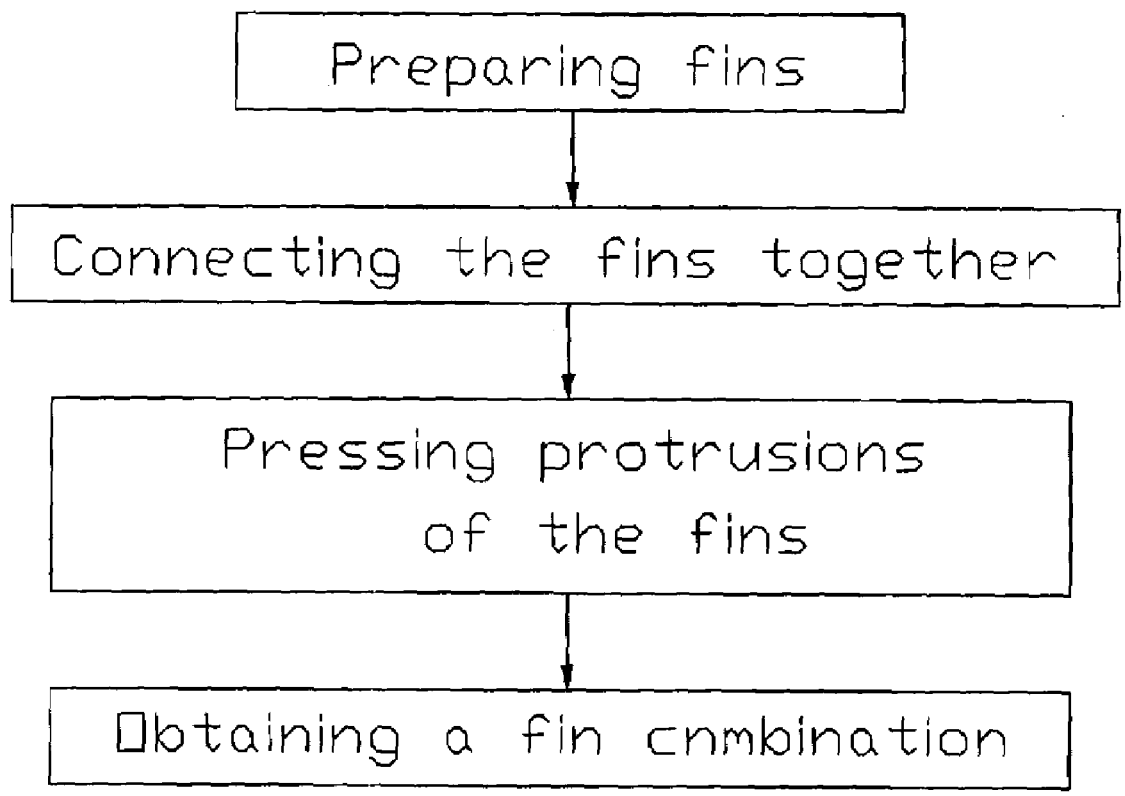
FIG. 5 is a flow chart of a process for manufacturing the fin combination of FIG. 3.
Figure 6:
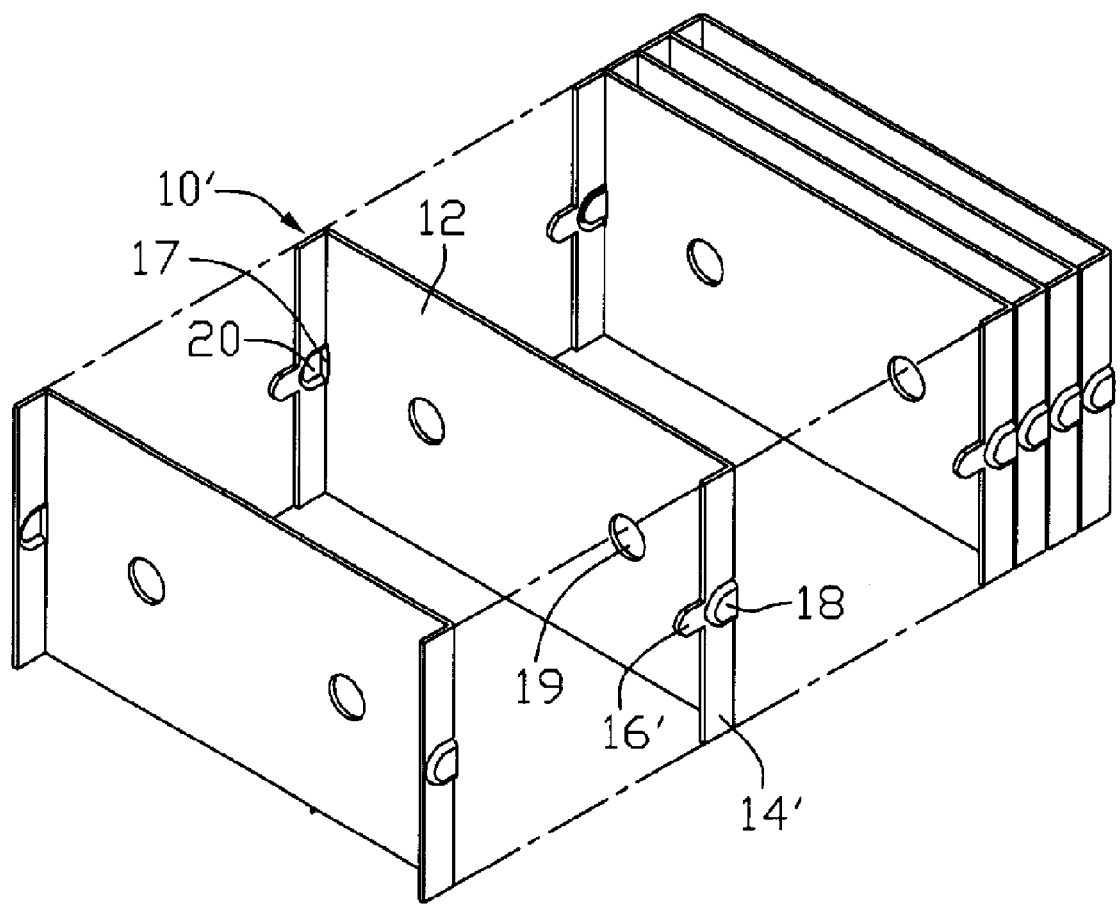
FIG. 6 is an isometric view of a semi-finished product of the fin combination before a pressing action is applied thereto.
Figure 7:
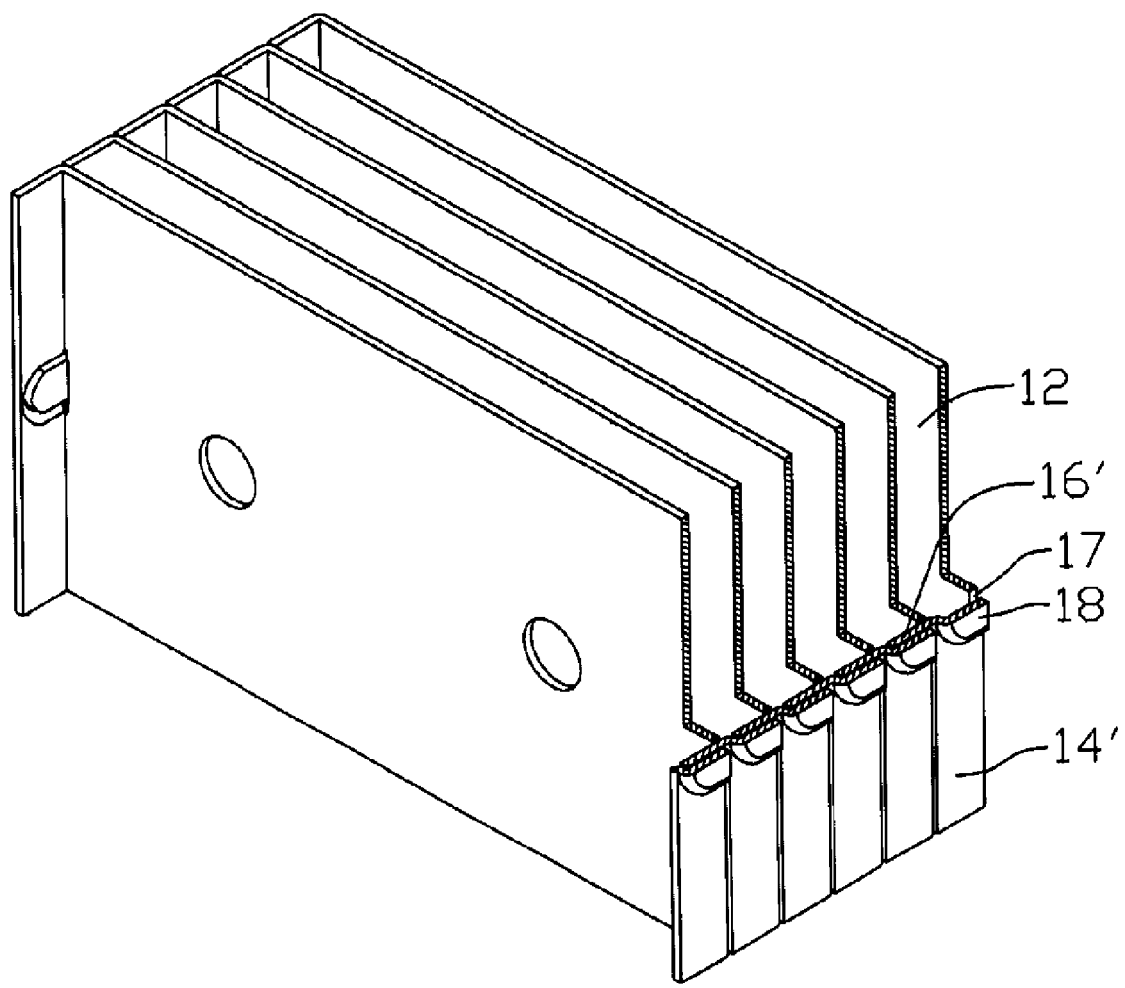
FIG. 7 is a view of similar to FIG. 6 with a part being cut away.
Figure 8:
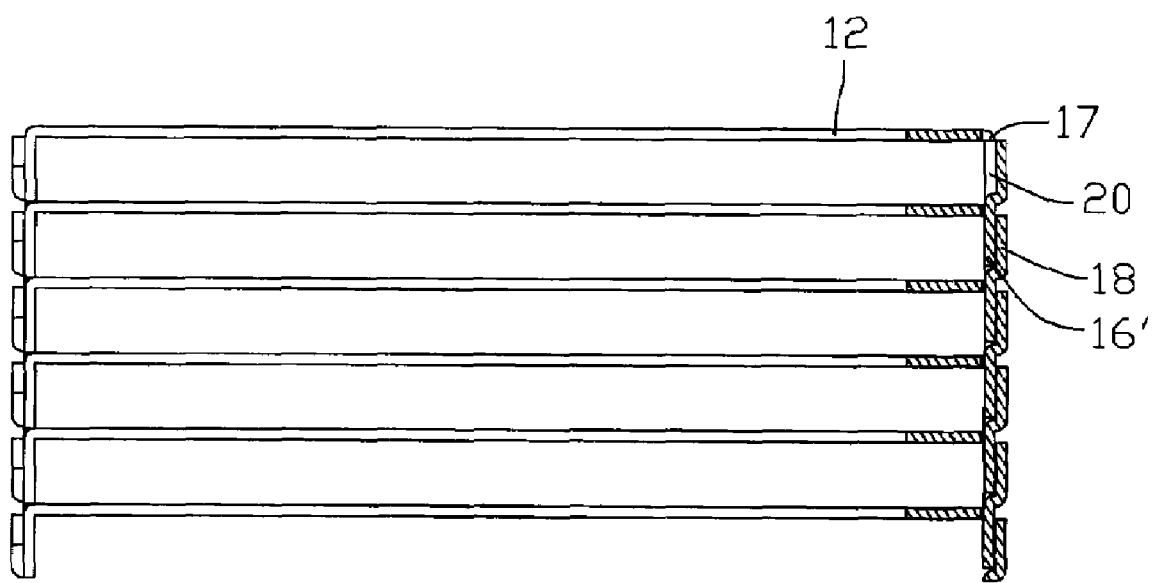
FIG. 8 is a top plan view of FIG. 7.

FIG. 5 shows a flowchart of a process for manufacturing the fin combination 10 as described above. The process comprises following steps in sequence: preparing fins, connecting the fins together, pressing protrusions 18 of the fins, and obtaining the fin combination 10. FIG. 6 to FIG. 8 are made to describe the process in detail. Following is a detailed description how the fin combination 10 is made.

Referring to FIG. 6, a plurality of fins 10' is prepared. Each fin 10' includes a body 12 and two flanges 14'. The flanges 14' extend from opposite sides of the body 12 respectively and vertically. A slot 17 is formed at a junction portion of the body 12 and the flange 14'. A recess 20 is defined in an inner side of the flange 14' and communicates with the slot 17. A protrusion 18 is formed at the outer side of the flange 14' corresponding to the recess 20. A tab 16' extends from a front edge of the flange 14'. The tab 16' and the flange 14' are coplanar. Two holes 19 are defined in the body 12. The recess 20 has a shape corresponding to that of the tab 16'.

Referring to FIG. 7 and FIG. 8, the fins 10' are connected by inserting the tabs 16' of a fin 10' into the recesses 20 of an adjacent fin 10' through the slots 17 of the adjacent fin 10' in front of the fin 10' to reach a position where the flanges 14' of the fin 10' abut against to the body 12 of the adjacent fin 10'. This step is repeated until all of the tabs 16' of the fins 10' are inserted into corresponding recesses 20. During this process, two posts (not shown) can be inserted into the holes 19 to function as guiding posts for facilitating the connection of a fin 10' with a front fin 10'.

Figure 2:
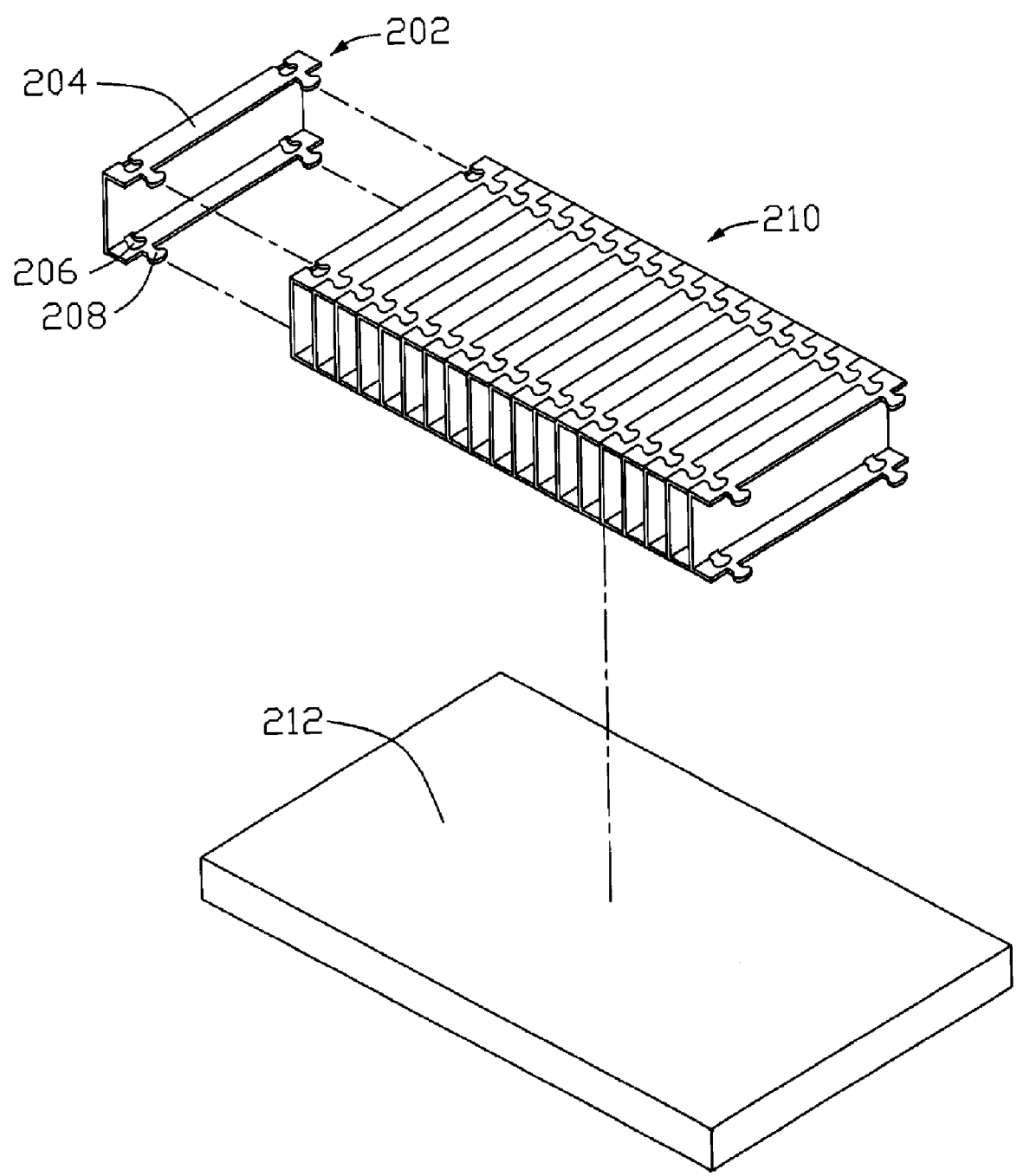
FIG. 2 is an exploded view in accordance with another conventional heat sink.

Then the protrusions 18 of the flanges 14' of the fins 10' in total as shown in FIG. 6 are then pressed to be flat. The protrusions 18 are deformed to be coplanar with the flanges 14'. The tabs 16' originally received in the corresponding recesses 20 are bent inwardly to be located inside of the flanges 14'. Thus the fin combination 10 of FIGS. 1 and 2 is obtained. Also referring back to FIGS. 3 and 4, by the pressing of the protrusions 18, the detents 160 are formed. Each dent 160 is formed at the junction portion between the tab 16' and the flange 14' integral with the tab 16'. The detent 16 of a fin abuts against the flange 14 and body 12 of an adjacent fin in front of the fin with outer and inner sides of the detent, respectively, whereby the fins of the fin combination 10 are securely connected together to have a sturdy structure. The detents 160 of the fin are located near the slots 17 of the adjacent fin in front of the fin, respectively.

Finally, the fin combination 10 is soldered to the metal base (not shown) as mentioned above to obtain the heat sink. During the process of soldering, two heat pipes (not shown) can also be soldered in the holes 19 and the metal base to facilitate heat transfer from the metal base to the fin combination 10.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink comprising:
   a fin combination comprising a plurality of fins interconnected together, each fin comprising:
   a body;
   a flange bent from an edge of the body, the flange having an outer edge opposing to the body;
   a tab extending from the outer edge of the flange;
   a detent formed at a junction portion between the tab and the flange; and
   a slot formed in a junction between the body and the flange;
   wherein the tab of a fin extends through the slot of an adjacent fin with the detent of the fin abuts the body of the adjacent fin, the flange of the adjacent fin contacts the detent of the fin, the tab of the fin contacts an inner side of the flange of the adjacent fin and the flange of the adjacent fin is pressed to the tab of the fin to connect therewith.

2. The heat sink as described in claim 1, wherein the body further comprises a hole defined therein.

3. A method for assembling a heat sink, comprising steps of:
   a). preparing a plurality of fins each comprising a body with a flange extending perpendicularly from the body, a tab extending from the flange, and a slot formed between the body and the flange, the flange forming a protrusion on an outer side thereof;
   b). inserting the tab of a fin into a slot of an adjacent fin to a position where the tab is located neighboring the protrusion of the flange of the adjacent fin; and
   c). pressing the protrusion of the flange of the adjacent fin to flatten the protrusion to thereby securely fasten the flange of the adjacent fin and the tab of the fin together, wherein a detent is formed at a junction between the tab and the flange of the fin.

4. The method for assembling a heat sink as described in claim 3, wherein the flange of the adjacent fin further comprises a recess in an inner side thereof corresponding to the protrusion, and at the step b), the tab of the fin is inserted into the slot and received in the recess.

5. The method for assembling a heat sink as described in claim 4, wherein the recess has a shape corresponding to that of the tab.

6. The method for assembling a heat sink as described in claim 4, wherein the body defines a hole therein.

7. The method for assembling a heat sink as described in claim 4, further comprising a step d) following the step c):
   d). mounting the fin combination on a metal base.

* * * * *